(12) United States Patent
Liu et al.

(10) Patent No.: US 9,331,023 B1
(45) Date of Patent: May 3, 2016

(54) DEVICE PACKAGING

(71) Applicant: TAIWAN SEMICONDUCTOR MANUFACTURING COMPANY LTD., Hsinchu (TW)

(72) Inventors: Ming-Kai Liu, Hsinchu (TW); Yu-Peng Tsai, Taipei (TW); Kai-Chiang Wu, Hsinchu (TW); Wei-Hung Lin, Hsinchu County (TW); Hao-Yi Tsai, Hsinchu (TW); Mirng-Ji Lii, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/555,949

(22) Filed: Nov. 28, 2014

(51) Int. Cl.
| H01L 23/48 | (2006.01) |
| H01L 23/52 | (2006.01) |
| H01L 23/544 | (2006.01) |
| H01L 23/00 | (2006.01) |
| H01L 23/31 | (2006.01) |
| H01L 23/29 | (2006.01) |
| H01L 23/498 | (2006.01) |

(52) U.S. Cl.
CPC ............ *H01L 23/544* (2013.01); *H01L 23/293* (2013.01); *H01L 23/3114* (2013.01); *H01L 23/3128* (2013.01); *H01L 23/3135* (2013.01); *H01L 23/3171* (2013.01); *H01L 23/49816* (2013.01); *H01L 24/03* (2013.01); *H01L 24/05* (2013.01); *H01L 24/09* (2013.01); *H01L 24/13* (2013.01); *H01L 24/81* (2013.01); *H01L 24/94* (2013.01); *H01L 2224/0231* (2013.01); *H01L 2224/0239* (2013.01); *H01L 2224/02373* (2013.01); *H01L 2224/0401* (2013.01); *H01L 2224/13024* (2013.01); *H01L 2224/16225* (2013.01); *H01L 2224/81191* (2013.01); *H01L 2224/81801* (2013.01); *H01L 2924/01029* (2013.01)

(58) Field of Classification Search
CPC ..... H01L 24/05; H01L 24/81; H01L 23/3114; H01L 23/3135; H01L 24/03; H01L 23/293; H01L 23/3171; H01L 2224/81801; H01L 2224/02373; H01L 2224/0401; H01L 2224/0231; H01L 2224/13024; H01L 2224/0239; H01L 2224/16225; H01L 2224/81191; H01L 2924/01029; H01L 23/544; H01L 24/13; H01L 24/97; H01L 23/49816
USPC .................................. 257/737, 797, 738, 778
See application file for complete search history.

(56) References Cited

U.S. PATENT DOCUMENTS

| 6,438,281 | B1 * | 8/2002 | Tsukamoto | G02B 6/138 |
| | | | | 385/14 |
| 6,465,898 | B1 * | 10/2002 | Hnilo | H01L 23/544 |
| | | | | 257/734 |
| 2011/0127669 | A1 * | 6/2011 | Mizuhara | B23K 1/0016 |
| | | | | 257/737 |
| 2011/0180877 | A1 * | 7/2011 | Koketsu | H01L 23/544 |
| | | | | 257/368 |
| 2014/0252558 | A1 * | 9/2014 | Yu | H01L 23/3192 |
| | | | | 257/618 |

* cited by examiner

*Primary Examiner* — Shouxiang Hu
(74) *Attorney, Agent, or Firm* — WPAT, P.C., Intellectual Property Attorneys; Anthony King

(57) ABSTRACT

Some embodiments of the present disclosure provide a semiconductive device, including a semiconductive substrate. A conductive pad is on the semiconductive substrate. A passivation layer covers the conductive pad and overlies the semiconductive substrate. A first protective layer overlies the passivation layer. The first protective layer includes an opening exposing a portion of the passivation layer, and the opening includes at least two lines in contact with each other. A post passivation interconnect (PPI) layer overlies the first protective layer. A conductor forms on the PPI layer.

20 Claims, 19 Drawing Sheets

DEVICE PACKAGING

BACKGROUND

In a manufacturing of a wafer-level chip scale packages (WLCSP), a metal pad is electrically coupled to a solder ball. A passivation layer and a protective layer are on the metal pad. The metal pad is connected to the solder ball through some openings in the passivation layer and the protective layer.

Some dies in WLCSP that are formed on a wafer is separated by a process referred to as a singulation. These wafers are aligned and singulated into some individual dies. Some alignment marks on a wafer are used for aligning a wafer before singulation. A clear and recognizable alignment mark can result in an accurate singulation process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
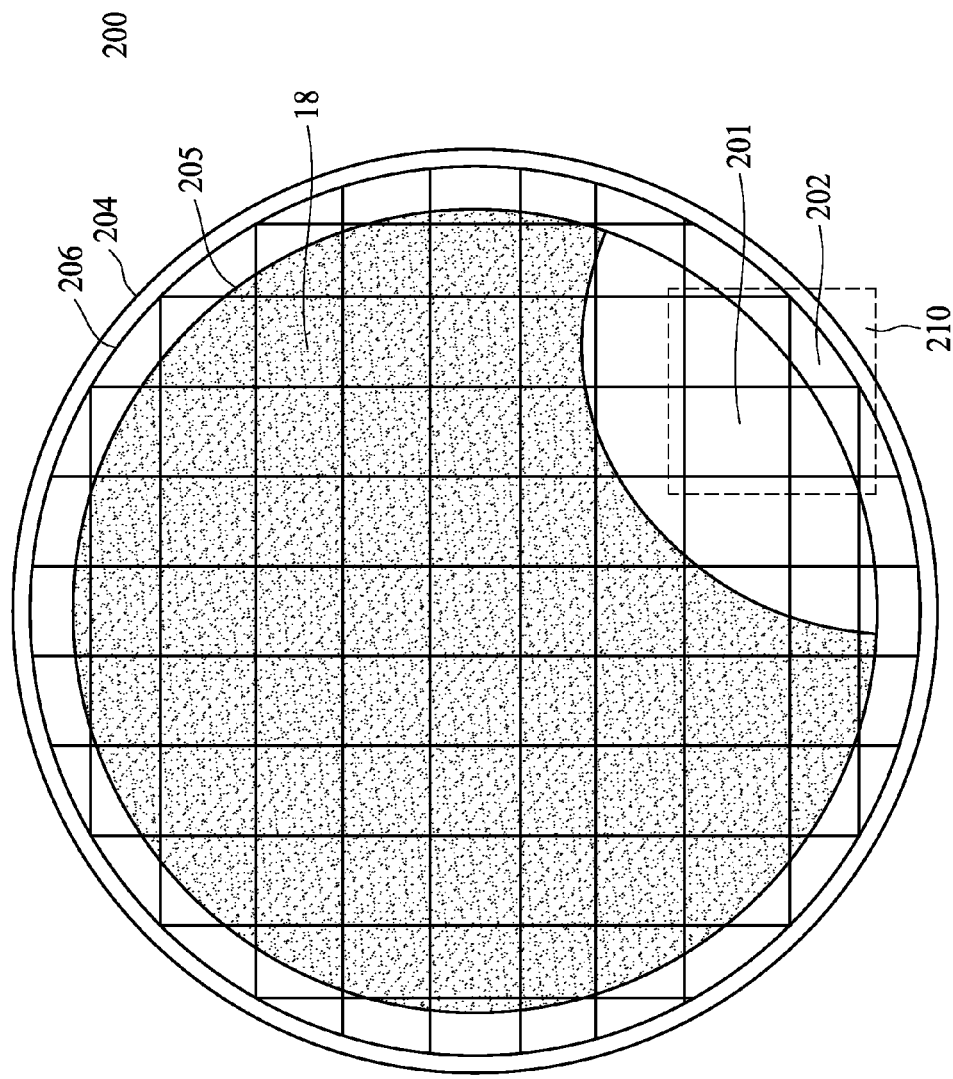
FIG. 1 is a plan view of a wafer with some dies, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In FIG. 1, a wafer 200 is illustrated. In some embodiments, wafer 200 is a thin piece of semiconductor material, such as a silicon crystal, used in the manufacture of integrated circuits and other devices. The devices can be some semiconductive devices. Wafer 200 can be a semiconductor wafer. The wafer 200 includes substrate for electronic devices built in and over the wafer. The electronic devices can be some transistors, resistors, capacitors, inductors, or other semiconductor devices. In some embodiments, the electronic devices in die 201 can be in a package. One type of package for semiconductor devices is wafer level package (WLP). Wafer level packages (WLP) can be used with integrated circuits (ICs) with high speed, high density, and high number of pin count.

Many fabrication process operations such as doping, ion implantation, etching, layering, deposition of various materials, or photolithographic patterning can apply to wafer 200 for fabricating the electronic devices into some integrated circuits. Further, some individual integrated circuits are separated and packaged. In some embodiments, a separation of each integrated circuit is referred to as singulation or dicing. Before singulation of wafer 200, alignment of wafer 200 is performed to ensure a precise separation of each die 201.

In some embodiments, a die 201 is an integrated circuit die. Throughout this description, a term die is used to refer to both singular and plural. A size of die 201 is only for illustrative purposes and may not be drawn to scale. Wafer 200 can include a plurality of die 201. In some embodiments, dies 201 are duplicated of each other. Wafer 200 also includes some incomplete die 202 at around a perimeter 204 of wafer 200. Some incomplete die 202 is in a shape of a wedge with one side being a curved edge, which is a portion of perimeter 204. Some incomplete die 202 includes some parts of similar structures and formations of a die 201, with some other parts being cut off beyond perimeter 204 of wafer 200. Near a perimeter 204 of wafer 200 is a sectional view 210 encompassing die 201 and incomplete die 202 for illustrative purpose.

In FIG. 1, a liquid molding compound (LMC) layer, which is also a second protective layer 18, is covering on top of wafer 200 in a shaded region. The LMC is covering wafer 200 up to boundary 205, proximate to perimeter 204. There are some non-shaded regions within boundary 205. The non-shaded regions is also covered by second protective layer 18, it is non-shaded only for illustrative purpose. In some embodiments, boundary 205 is distanced from perimeter 204 by around 3 millimeters. Some surfaces of incomplete die 202 include some portions covered by second protective layer 18, and some other portions being exposed and not covered by second protective layer 18.

In some embodiments, there is boundary 206 between boundary 205 and perimeter 204. Boundary 206 surrounds a region where some underlying electronic devices such as transistors are placed along with some interconnected structures. The region is referred as a back end of line (BEOL) region, where components are formed in the BEOL processes. Another region outside of boundary 206 and within perimeter 204 can include mostly a polybenzoxazole (PBO) material.

Figure 2:
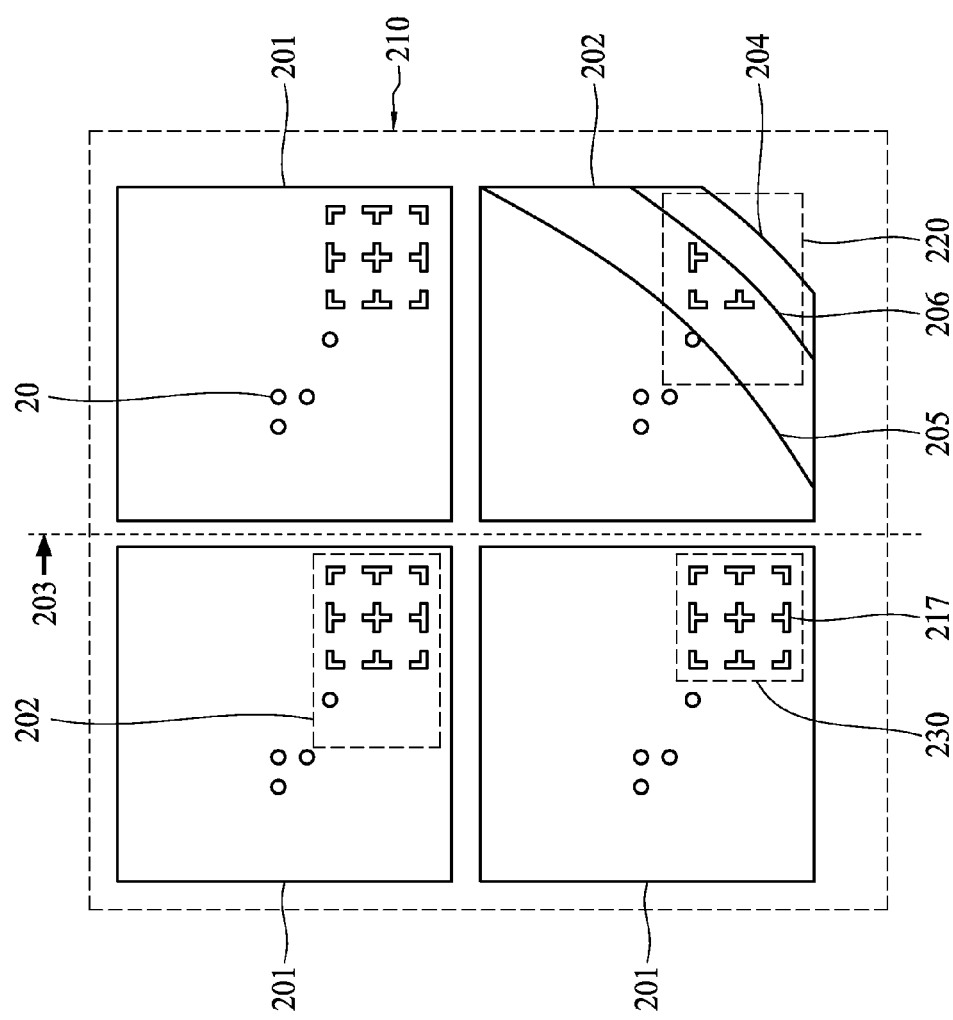
FIG. 2 is an enlarged view of a portion of FIG. 1 showing some dies, in accordance with some embodiments of the present disclosure.

FIG. 2 is a magnified view of the sectional view 210 in FIG. 1. Each die 201 includes conductor 20 and marks 217. In some embodiments, conductor 20 is a solder material. Marks 217 are designed in a mark arrangement 230. Marks 217 are arranged in a pattern. The mark arrangement 230 can be some groups of marks 217 scattered throughout a surface of die 201. In some embodiments, mark arrangement 230 is in a three by three fiducial array. In some embodiments, mark 217 and mark arrangement 230 are configured for an alignment of wafer 200.

The alignment of wafer 200 includes using a field of vision (FOV) of a die saw tool to spot mark 217. The FOV of a die saw tool is configured to detect lines and a point where the lines meet. By detecting two or more intersecting points from line segments of marks 217, an orientation of wafer 200 is detected and matched with an orientation of die saw tool. In some embodiments, a die saw tool can cut along a cutting line 203 in FIG. 2. The cutting line 203 is in a space between dies 201, also known as a street.

Some patterns of conductor 20 and mark arrangement 230 are similar from one die 201 to another. In some embodiments, in die 201, a sectional view 212 is drawn to enlarge conductor 20 and mark arrangement 230. In some other embodiments, in incomplete die 202, a sectional view 220 is drawn to include conductor 20 and mark arrangement 230.

In incomplete die 202, some conductors 20 are within boundary 205 and covered by second protective layer 18. Some other conductors 20 near perimeter 204 are outside of boundary 205 and not covered by second protective layer 18.

Figure 3:
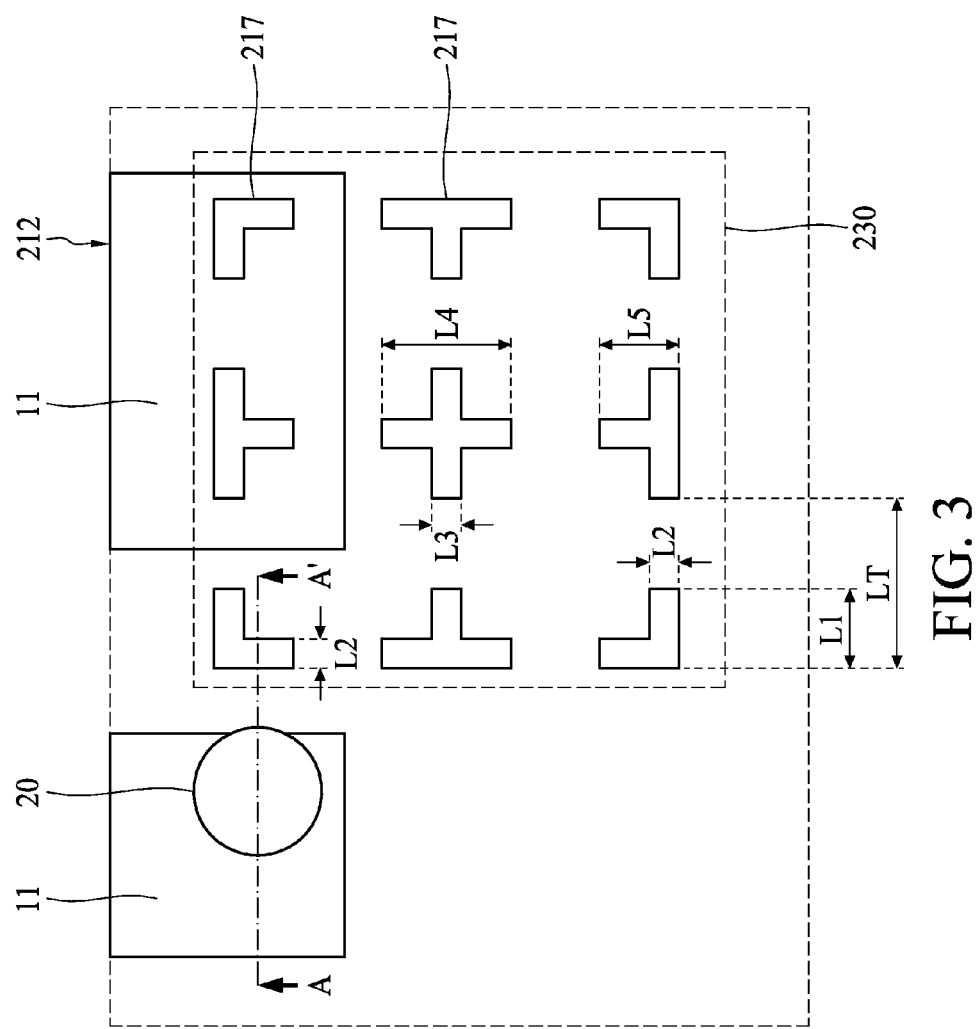
FIG. 3 is an enlarged view of a portion of FIG. 2, in accordance with some embodiments.

FIG. 3 is a magnified view of sectional view 212 in FIG. 2. In some embodiments, marks 217 can have different shapes. Marks 217 can be a T shape, an L shape, or a cross shape. A dimension of each mark 217 is determined depending on some factors. The factors can be some areas covered by some features on a surface of die 201. A density distribution of the features can also be different within different parts of die 201. The features can include conductor 20 or some metal wires. The factors can also be a size area of wafer 200 and/or die 201. In some embodiments, marks 217 covers total of less than 10 percent of a surface area of die 201. An area of a view observable by a FOV is also one of the factors. In some embodiments, some dimensions in mark arrangement 230 are determined. For example, in some embodiments, the dimensions include length L1, width L2, or separation length LT in FIG. 3. The area covered by FOV is a square with a side length of 70 micrometers. The area of the square is around 4,900 micrometers square. A width L2 of a line segment in an L shaped mark is around 10 micrometers. A length L1 of a line segment in an L shaped mark is around 40 micrometers. The L shaped mark is small enough and within the area for the FOV to detect. Two line segments of mark 217 are orthogonal to each other. By detecting some directions of the line segments of mark 217, an orientation of wafer 200 can be determined. The die saw tool can align the orientation of wafer 200.

In FIG. 3, a cross sectional line AA' is drawn crossing through conductor 20 and a line segment of an L shaped mark. Cross sectional line AA' is crossing through the line segment in a direction that is parallel with the line segment. Bonding pads 11 are also within sectional view 212. One bonding pads 11 is under conductor 20 and another is under mark 217.

Figure 4:
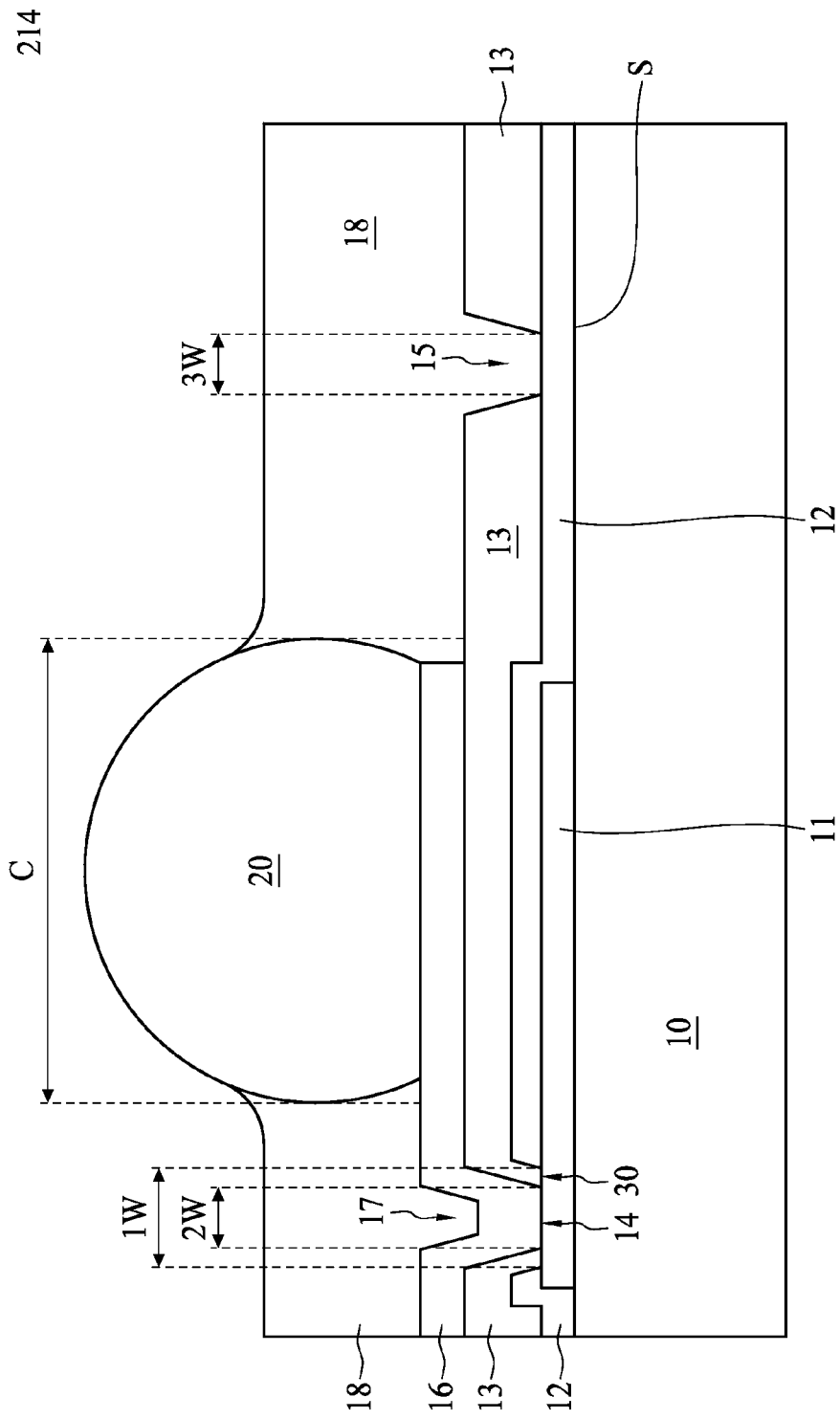
FIG. 4 is a cross-sectional view of a portion of FIG. 3, in accordance with some embodiments.

FIG. 4 is a cross sectional view 214 of a plane sliced from cross sectional line AA' in FIG. 3. Referring to FIG. 4, a semiconductive substrate 10 is a silicon substrate. The silicon substrate can include some semiconductor materials such as silicon carbon, silicon germanium, gallium arsenide, or the like. In some embodiments, a portion of semiconductive substrate 10 can include, for example, bulk silicon, doped or undoped, or an active layer of a semiconductor-on insulator (SOI) substrate. Semiconductive substrate 10 includes a layer of the semiconductor materials formed on an insulator layer. The insulator layer can be a buried oxide (BOX) layer or a silicon oxide layer. In some embodiments, the insulator layer is provided on a glass substrate. Other substrates, such as a multi-layered, epitaxial, or gradient substrate can also be used.

In some embodiments, some devices (not shown) can be formed at surface S of semiconductive substrate 10. The devices can be some electrical devices or some semiconductor devices such as various N-type metal oxide semiconductor (NMOS) and/or P-type metal-oxide semiconductor (PMOS) devices, transistors, resistors, diodes, capacitors, inductor, photo-diodes, fuses, and the like. The device is formed over semiconductive substrate 10.

Semiconductive substrate 10 includes some electrical circuitries (not shown). The electrical circuitry can include some interconnect structures (not shown). The Interconnect structures can further include some metal lines and some vias (not shown) formed therein and electrically coupled to the devices. The interconnect structures can be made of copper.

The metal lines and vias can be formed in low-k dielectric layer, which is extreme (or extra) low-k (ELK) dielectric layer. Some dielectric layers are overlying the devices. Metal lines or metal layers are formed between the dielectric layers to electrically connect some devices to each other. Some devices can also be formed in one or more dielectric layers. In some embodiments, the interconnect structures is connected to bonding pad 11 to electrically couple a device to bonding pad 11 in FIG. 4.

The electrical circuitry formed on semiconductive substrate 10 can be any suitable type of circuitry for certain application. The electrical circuitry is configured for functions such as storing memory, sensor, amplifying, power distributing, inputting/outputting, or the like. One of ordinary skill in the art will appreciate that the above examples are provided for illustrative purposes only and are not meant to limit the scope of the disclosure in any manner.

In FIG. 4, bonding pad 11 is over an interconnect structure. In some embodiments, bonding pad 11 is a conductive pad on semiconductive substrate 10. In some embodiments, bonding pad 11 is a metal pad, a conductive pad, or a contact pad. The metal pad comprises aluminum, copper, aluminum copper, aluminum alloys, silver, tin, copper alloys, gold, nickel, tungsten, other electrically conductive material. Bonding pad 11 is electrically coupled to the devices; for example, through an underlying interconnect structure. The interconnect structure within some intermediate layers is between bonding pad 11 and the devices.

The sizes, shapes, patterns, and locations of bonding pads 11 can be determined for various designed purposes. Die 201 can contain a plurality of bonding pad 11. The plurality of bonding pad 11 of die 10 can be of equal size or of different sizes. In some embodiments, bonding pads 11 are formed and connect to another die. In some embodiments, bonding pads 11 is configured for wire bonding or flip-chip bonding.

In some embodiments, some integrated circuits include pluralities of device such as transistors, resistor, inductors, and capacitors. These devices are interconnected together by some horizontal interconnections, such as metal lines, and vertical interconnections, such as vias or contacts. On top of an interconnect structures, bonding pads 11 are formed and exposed on a surface of a chip, or die 201. Die 201 can include a plurality of bonding pads 11 connected to a plurality of conductors 20 through a network of RDLs. Some electrical signals from the devices are routed through the network of RDLs to one or more of conductors 20.

In some embodiments, bonding pads 11 are overlying separately from each other on semiconductive substrate 10, such that some spaces are formed between bonding pads 11. A passivation layer 12 is covering comformally on top of bonding pads 11 and filling the spaces between bonding pads 11. Some portions of passivation layer 12 are overlying and in contact with semiconductive substrate 10. In some embodiments, passivation layer 12 covers side portions of bonding pad 11. A first opening 30 is formed in passivation layer 12. The first opening 30 of passivation layer 12 is located over bonding pads 11. The shape, size, and location of the first opening 30 are for illustration purposes and are not limiting. The first opening 30 of passivation layer 12 is for bonding pad 11 to be connected to layers above passivation layer 12. A width 1W of first opening 30 is illustrated in FIG. 4.

In an exemplary embodiment, passivation layer 12 composes of dielectric materials such as polyimide (PI), silicon nitride, silicon oxynitride, benzocyclobutene (BCB), silicon dioxide, undoped silicate glass (USG), polybenzoxazole (PBO), silicon oxide, other insulating material, non-porous material, or multi-layers thereof. A passivation layer 12 is formed over semiconductive substrate 10 on top of surface S and on top of bonding pad 11 for structural support and electrical or physical isolation.

In some embodiments, passivation layer 12 can be a single layer or a multilayer structure, or a laminated layer. One of ordinary skill in the art will appreciate that a bonding pad 11 and a passivation layer 12 are shown for illustrative purposes. As such, other embodiments can include any number of bonding pad 11 and/or passivation layers 12.

In FIG. 4, a first protective layer 13 is overlying on top of passivation layer 12. First protective layer 13 is covering on top of passivation layer 12 and lining to a wall of first opening 30, such that some thin portions of first protective layer 13 are in contact with bonding pad 11. A second opening 14 is in first protective layer 13 exposing some underlying portions of bonding pad 11, illustrated in FIG. 4. The second opening 14 of first protective layer 13 is located at first opening 30. A width 2W of second opening 14 is illustrated in FIG. 4. In some embodiments, second opening 14 is placed within first opening 30, such that a width 2W is shorter than width 1W of first opening 30. Second opening 14 of first protective layer 13 is for bonding pad 11 to be exposed and connected to layers above first protective layer 13.

First protective layer 13 includes at least one opening over passivation layer 12. A third opening 15 is in first protective layer 13 exposing some portions of an underlying passivation layer 12. A width 3W of third opening 15 is illustrated in FIG. 4. For illustration purposes, third opening 15 is a cross-sectional view of one of a mark 217 in FIG. 3. Width 3W of third opening 15 can represent some other lengths or widths. For examples, marks 217 include widths L2, widths L3, and lengths L4, or lengths L5 in FIG. 3. Third openings 15 can be grouped to a pattern collectively, referred as a patterned opening, or mark arrangement 230. The mark arrangement 230 can be designed in an array. The arrays include at least two types of mark 217. For example, one array arranged horizontally includes marks 217 with a cross shape. Another array arranged vertically includes marks 217 with a T shape. Third openings 15 in FIG. 4, in a cross sectional view 214, are marks 217, in FIG. 3, in plan view.

In FIG. 4, first protective layer 13 can be composed of a polymer material such as an epoxy, polyimide, benzocyclobutene (BCB), polybenzoxazole (PBO), and the like. In some embodiments, other organic, relatively soft, dielectric materials can also be used.

A depth of third opening 15 can be determined for different designed purposes. In some embodiments, third opening 15 of first protective layer 13 is located at some region outside of coverage C of conductor 20. Coverage C is defined by an outer periphery of conductor 20 projected onto any surface directly underneath conductor 20, illustrated in FIG. 4. In some embodiments, an outer periphery is projected onto a surface of first protective layer 13. An outer periphery can also be projected onto a surface of post passivation interconnect (PPI) layer 16. Throughout this description, a term PPI layer 16 is used to refer to post passivation interconnect layer 16. PPI layer 16 can also be an interconnect layer.

PPI layer 16 is overlying first protective layer 13. PPI layer 16 is covering first protective layer 13 and lining along second opening 14 in first protective layer 13. Some portions of PPI layer 16 is in contact with a surface of bonding pad 11. PPI layer 16 is electrically coupled with an underlying bonding pad 11. PPI layer 16 is following a contour of the second opening 14. PPI layer 16 is comformally lying on first protective layer 13 such that a recess 17 is over second opening 14. In some embodiments, width 2W of second opening 14 is about a width of recess 17. Recess 17 can also have a width 2W. A width 2W of recess 17 is illustrated in FIG. 4. In some embodiments, width 2W is close to width 1W.

In some embodiments, PPI layer 16 can include an under bump metallization (UBM) layer (not shown). The UBM layer can consist of Ti, Ni, NiV, Cu, Cu alloy, any metal or electrically conductive material. PPI layer 16 can have any size and shape for different embodiments. In some embodiments, PPI layer 16 can have more than one sub-layer.

In some embodiments, PPI layer 16 is electrically coupled with bonding pad 11. PPI layer 16 is configured to be a redistribution layer. Throughout this description, a term RDL is used to refer to as the redistribution layer. The bonding pad 11 can be electrically coupled with an RDL. In some embodiments, an RDL is overlying following a contour of first protective layer 13 and filling second opening 14. An RDL can be made of Al, nickel vanadium (NiV), Ni, Cu, Cu alloy, other mobile conductive materials. An RDL can be in a single layer structure, or a multilayers structure. For example, the RDL includes a top layer containing nickel and a bottom layer containing copper. In some embodiments, an interconnect structures (not shown) are connected to bonding pad 11, which is electrically coupled with an RDL to form a network of wiring for a WLP. An RDL can extend a connection between bonding pad 11 and conductor 20. The connection is lengthened for the network of wiring to form a fan in/out wiring structure. The fan in/out wiring structure enables conductors 20 on PPI layer 16 to separate from each other by a predetermined distance. In some embodiments, PPI layer 16 is configured to have a function of a power lines, inductors, resistors, capacitors or any passive device.

In FIG. 4, a conductor 20 is positioned on PPI layer 16. Conductor 20 can be a solder material. Conductor 20 is electrically coupled to bonding pad 11 through PPI layer 16, or through an RDL. In some embodiments, conductors 20 in a flip-chip packaging are configured to establish some electrical connections between some bonding pads 11, or I/O pads, of a die 201 and some lead frames of a package (not shown).

In some embodiments, conductor 20 is placed on a barrier layer (not shown). conductor 20 can be made of a lead-free pre-solder layer, SnAg, or a solder material containing alloys of nickel, tin, lead, bismuth, silver, copper, or combinations thereof. In some embodiments, conductor 20 can be configured for a die-level packaging, die-to-die bonding formation, wafer-level packaging, a die-to-Wafer bonding formation, a wafer-to-wafer bonding formation, or the like.

In FIG. 4, a second protective layer 18 is covering over PPI layer 16, first protective layer 13, and passivation layer 12. In some embodiments, second protective layer 18 includes a liquid molding compound (LMC). A portion of conductor 20 is above a surface level of second protective layer 18. Second protective layer 18 is in contact with outer periphery of conductor 20. In some embodiments, second protective layer 18 is covering recess 17 of PPI layer 16. Second protective layer 18 can also apply to a side of PPI layer 16. In some embodiments, second protective layer 18 is filling third opening 15 of first protective layer 13. Second protective layer 18 or first protective layer 13 are made of liquid molding compound, some non-organic material from undoped silicate glass (USG), silicon nitride, silicon oxynitride, silicon oxide, or combinations thereof.

Figure 5:
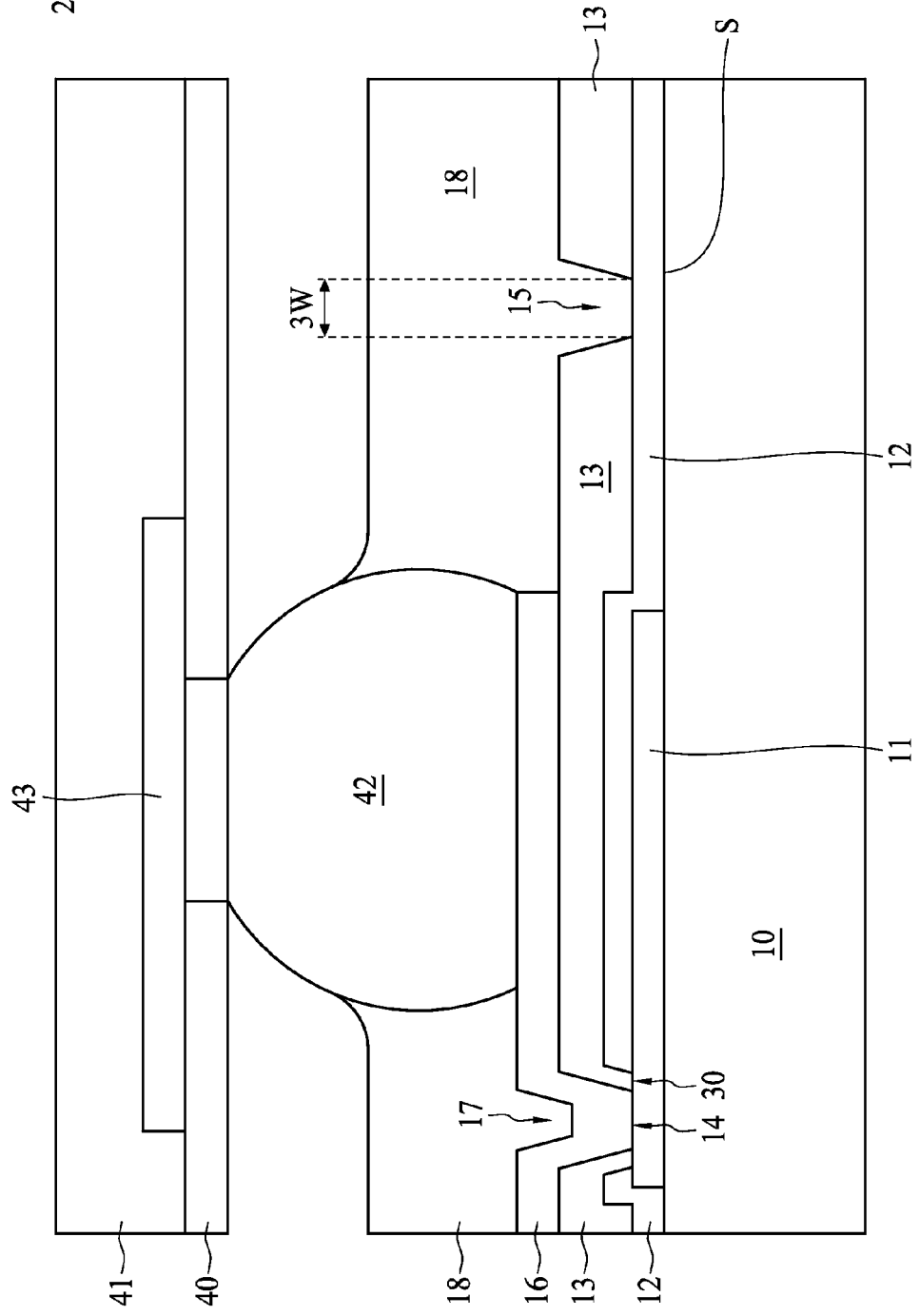
FIG. 5 is a cross-sectional view of a device, in accordance with some embodiments.

FIG. 5 is a cross sectional view 216 with an additional substrate 41 coupling to semiconductive substrate 10 in a flip-chip assembly. Conductor 20 is attached to an additional substrate 41 at a top of FIG. 5 to form a coupling structure 42. Additional substrate 41 can be a package substrate, board, a printed circuit board (PCB), an interposer substrate, a wafer, a die, or other suitable substrate. Coupling structure 42 is coupled to additional substrate 41 through any conductive region 43. Conductive region 43 can be a point, a pad, a trace, or a portion of a layer. For example, conductive region 43 is formed and patterned on additional substrate 41. In one embodiment, a mask layer 40 is covered on top of additional substrate 41 and some portions of conductive region 43. Mask layer 40 is a solder resist layer patterned on additional substrate 41 to expose some underlying portions of conductive region 43. Mask layer 40 has an opening for a solder joint formation. A conductive region 43 includes some alloys of tin, lead, silver, bismuth, copper, nickel, or combinations thereof. The additional substrate 41 can be electrically coupled to a semiconductive substrate 10 by coupling structure 42 between the conductive region 43 and a PPI 16. An exemplary coupling process includes a flux application, a chip placement, a reflowing of some melting solder joints, and/or cleaning of some flux residues. The semiconductive substrate 10, the coupling structure 42, and the additional substrate 41 can be collectively referred to as a packaging assembly, or a flip-chip packaging assembly.

Figure 6:
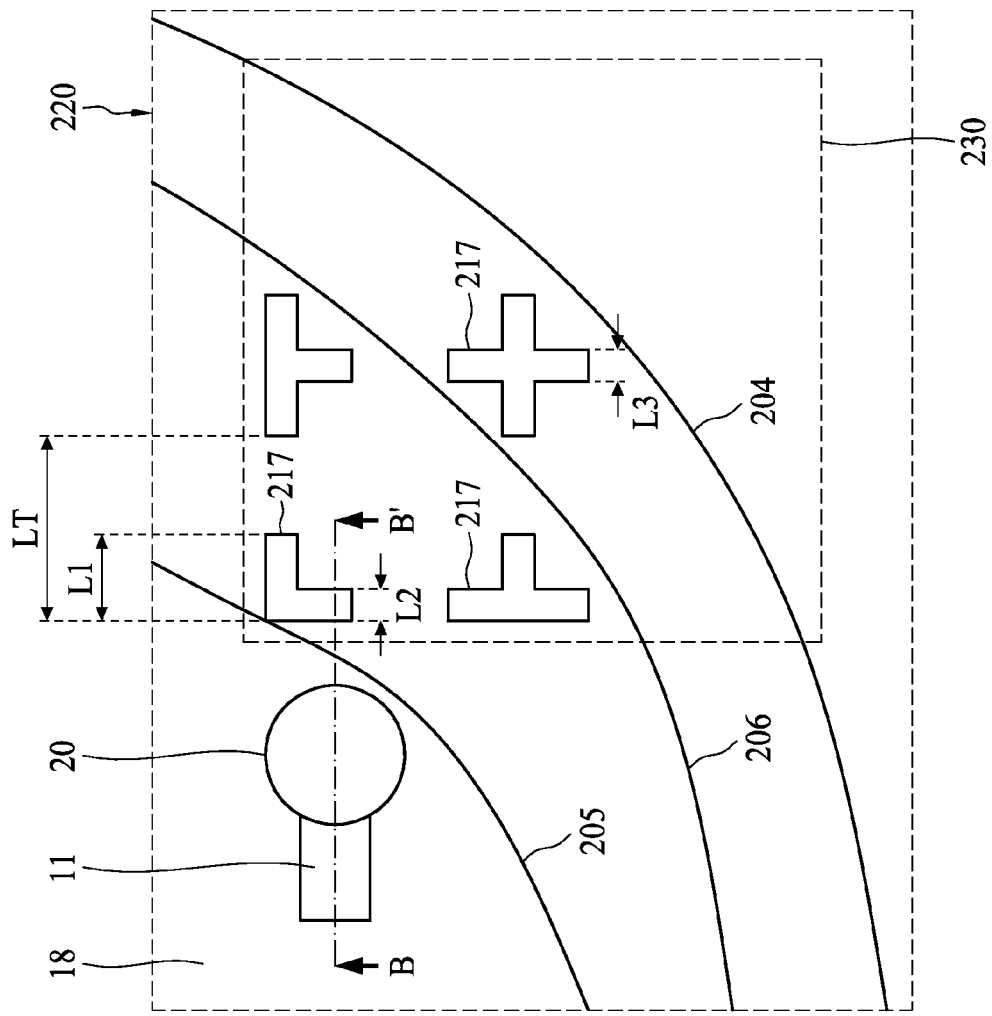
FIG. 6 is an enlarged view of a portion of FIG. 2, in accordance with some embodiments.

FIG. 6 is a magnified view of sectional view 220 from FIG. 2. Sectional view 220 is from a section near perimeter 204. A sectional view 220 is drawn to include conductor 20 and mark arrangement 230. Mark arrangement 230 can be designed in different patterns with different numbers of mark 217 or different shapes of mark 217. Conductor 20 can be a solder ball. In FIG. 6, mark arrangement 230 includes three marks 217. Marks 217 are outside of boundary 205 and near perimeter 204. Marks 217 in sectional view 220 are exposed and not covered by LMC or second protective layer 18, which is within boundary 205. Conductor 20 is within boundary 205 and partially covered by second protective layer 18. Bonding pad 11 is under conductor 20 and covered by second protective layer 18. A cross sectional line BB' is drawn crossing through conductor 20 and one of a mark 217, along with width W2 of the mark 217.

In some embodiments, marks 217 can have different shapes. Marks 217 can be a T shape, an L shape, or a cross shape. A dimension of each mark 217 can also be different. Marks 217 can be at some areas on first protective layer 13 at some distances away from conductor 20 or PPI layer 16. In some embodiments, marks 217 are covered at where a density distribution of the components is small.

For incomplete die 202, second protective layer 18 is covering up to around boundary 205. Some portions of first protective layer 13 is exposed and not covered by second protective layer 18. The portions are from boundary 205 to perimeter 204. Marks 217 in the portions can be some third openings 15 from a top point of view. A region enclosed by boundary 206 is where some underlying active devices such as transistors, resistors, or capacitors can be embedded. Some interconnected structures are also bounded by boundary 206. Bonding pad 11, PPI layer 16, conductor 20 or other conductive components are within a limit of boundary 206. The region is referred as a back end of line (BEOL) region, where components in BEOL process is placed. Another region outside of boundary 206 and within perimeter 204 can include passivation layer 12 or first protective layer 13. The region can be referred to as a PBO region. Marks 217 can be at the BEOL region as well as at the PBO region. In FIG. 6, a cross shaped mark is in the BEOL region.

In some embodiments, some dimensions of marks 217 are illustrated in FIG. 6. The dimensions include length L1, width L2, width L3 or separation length LT in FIG. 6. An area covered by a FOV is a square with a side length of 100 micrometers. The area of the square is around 10,000 micrometers square. A width L2 of a line segment in an L shaped mark is around 20 micrometers. A length L1 of a line segment in an L shaped mark is around 80 micrometers. A width L3 of a line segment in a cross shaped mark is around 20 micrometers. The L shaped mark is small enough and within the area for a FOV to detect. Mark 217 includes at least two line segments. Two line segments of an L shaped mark are orthogonal to each other. A distance between two marks 217 is a predetermined distance referred to as a pitch. An L shaped mark is distanced from a T shaped mark by a separation length LT. Separation length LT can be around 70 micrometers. By detecting some intersections of the line segments and the predetermined distance between marks 217, an orientation of wafer 200 can be derived. The die saw tool can align the orientation of wafer 200 with a sawing tool.

A FOV of a die saw tool is able to be configured to detect some edges between a PBO layer and passivation layer 12. The edges detected by the FOV are delineated by a contrast between first protective layer 13, which is made of PBO, or passivation layer 12 underneath. The edges are edges of third opening 15. The edges are some edges of a shape of mark 217. A FOV detects the edges for alignment of wafer 200.

In FIG. 6, a cross sectional line BB' is drawn crossing through conductor 20 and a line segment of an L shaped mark. Cross sectional line BB' is crossing through the line segment in a direction that is parallel with the line segment.

Figure 7:
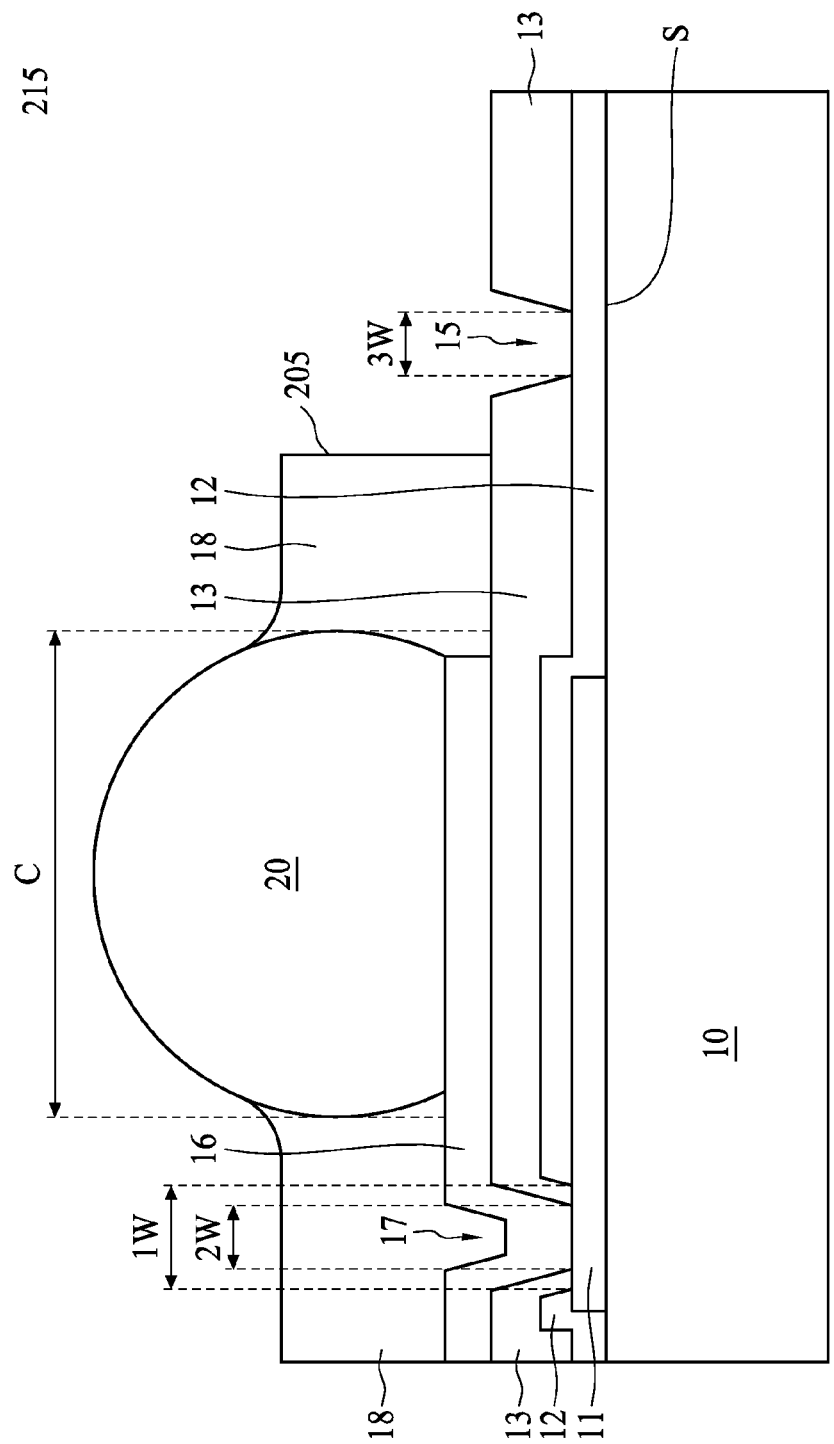
FIG. 7 is a cross-sectional view of a portion of FIG. 6, in accordance with some embodiments.

FIG. 7 is a cross sectional view 215 of a plane sliced from cross sectional line BB' in FIG. 6. In some embodiments, cross sectional view 215 is from incomplete die 202. A difference between FIG. 7 and FIG. 4 is that second protective layer 18 is cut off at boundary 205, as illustrated in FIG. 7. Conductor 20, PPI layer 16, and bonding pad 11 are within boundary 205. Third opening 15 can be outside of boundary 205 and in a BEOL region and a PBO region. In some embodiments, boundary 205 is over on top of third opening 15. In FIG. 7, second protective layer 18 is blanket over PPI layer 16, first protective layer 13, and passivation layer 12. In some embodiments, second protective layer 18 is made of a liquid molding compound (LMC). A portion of conductor 20 is above a surface level of second protective layer 18. Second protective layer 18 is surrounding some portions of conductor 20. In some embodiments, second protective layer 18 is covering recess 17. Second protective layer 18 can also apply to a side portion of PPI layer 16.

Figure 8:
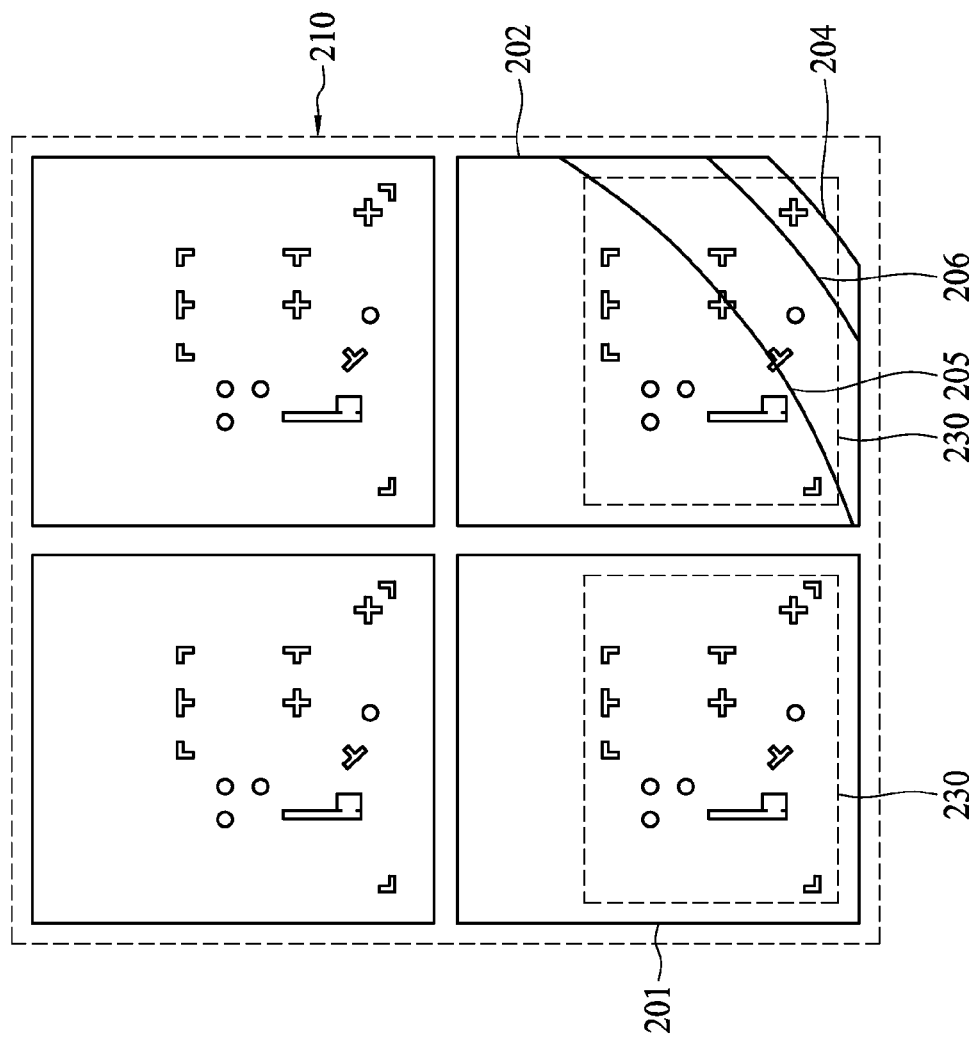
FIG. 8 is an enlarged view of a portion of FIG. 1 showing some other dies, in accordance with some embodiments.

FIG. 8 is another magnified view of the sectional view 212 in FIG. 1. Mark arrangements 230 in FIG. 8 are different from mark arrangements 230 in FIG. 2. Marks 217 are designed in a pattern of mark arrangement 230. In some embodiments, marks 217 in mark arrangement 230 can have different shapes, size, location, or orientation. For example, an L shaped mark is elongated in a certain direction. A T shaped mark is rotated 45 degree clockwise from a certain orientation. Marks 217 can be scattered over a surface of a die 201 and be in various pattern densities. In some embodiments, for marks 217 within perimeter 204, mark arrangement 230 is repeated from die 201 to incomplete die 202. In some other embodiments, mark arrangement 230 in incomplete die 202 is different from mark arrangement 230 in die 201. For example, on a wafer, on incomplete die 202, mark arrangement 230 can be some groups of marks 217 covering more than 10 percent of a total surface area of incomplete die 202. On the wafer, on die 201, mark arrangement 230 can be some groups of marks 217 covering less than 10 percent of a total surface area of die 201.

Figure 9:
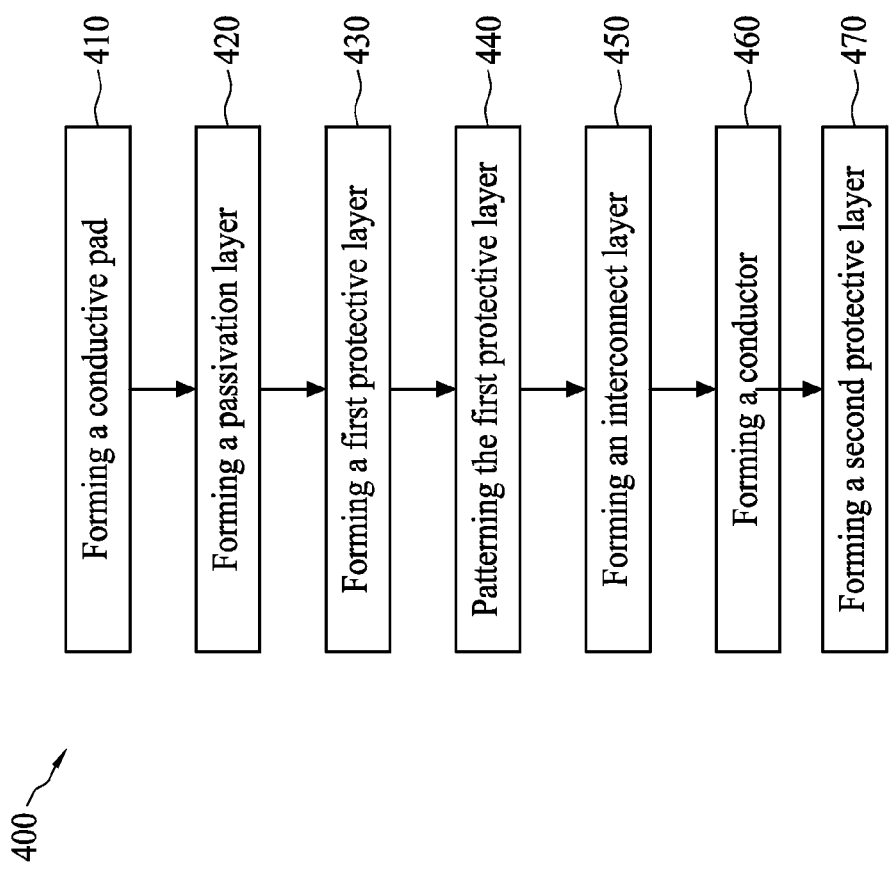
FIG. 9 is an operational flow of a method for manufacturing a device, in accordance with some embodiments of the present disclosure.

Referring to FIG. 9, several operations in a method 400 for manufacturing wafer 200 are listed from operation 410 to operation 470. Operation 410 is for forming of a conductive pad, or bonding pad 11. Operation 420 is for forming of a passivation layer 12. Operation 430 is for forming of a first protective layer 13. Operation 440 is for patterning the first protective layer 13. Operation 450 is for forming of an interconnect layer, or PPI layer 16. Operation 460 is for forming of a conductor 20. Operation 470 is for forming of a second protective layer 18.

Figure 10:
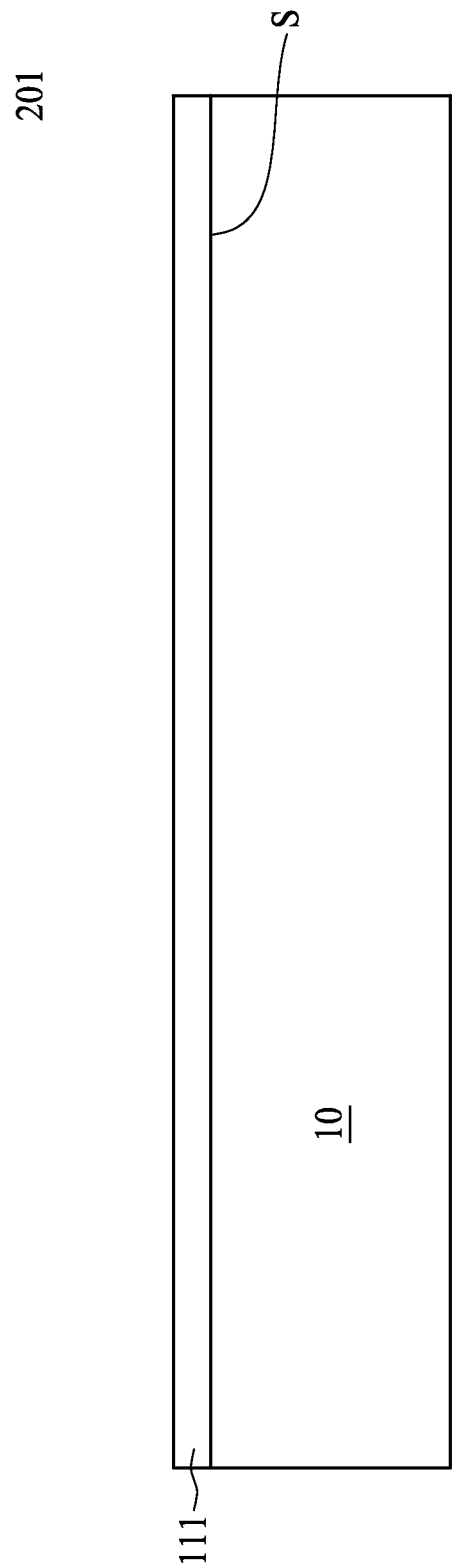
FIG. 10 to FIG. 19 are cross sectional views of an operation in a method for manufacturing a device, in accordance with some embodiments of the present disclosure.

FIG. 10 shows a semiconductive substrate 10 of die 201 provided with a conductive layer 111, which is overlying the semiconductive substrate 10. Conductive layer 111 is deposited over surface S of semiconductive substrate 10. In some embodiments, forming of some active devices, such as transistor is formed at semiconductive substrate 10. Then, some interconnect structures is formed on top of the active devices. Conductive layers 111 are then form on top of the interconnect structures, such that conductive layers 111 is electrically coupled with the interconnect structures and the active devices.

In an embodiment, conductive layer 111 is a thin film formed by a deposition process. The deposition process can include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, UV-ozone oxidation, epitaxial growth methods (e.g., selective epitaxy growth), sputtering, plating, electrolytic plating, electroless plating, spin-on coating, other suitable methods, and/or combinations thereof.

Figure 11:
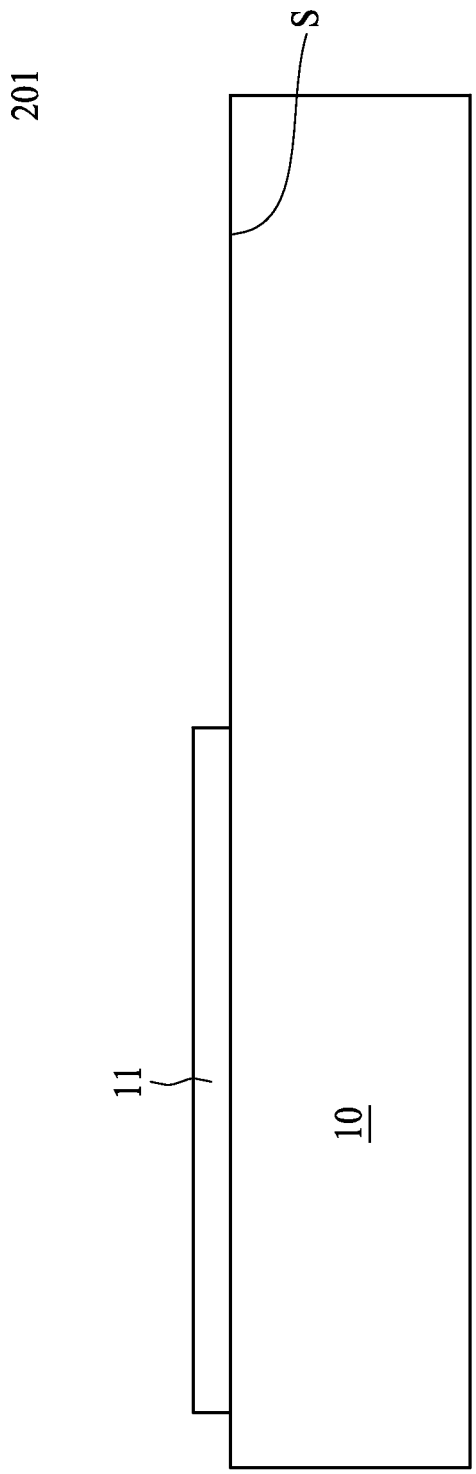

In FIG. 11, conductive layer 111 is formed into some bonding pads 11 on surface S using a patterning and deposition process. In one example, a layer of photoresist is formed over conductive layer 111 by a suitable process, such as spin-on coating, and patterned to form a photoresist feature by a proper photolithography patterning method. A pattern on the photoresist can then be transferred by an etching process to some underlying layers (i.e., conductive layer 111) to form bonding pads 11. The photoresist is stripped thereafter.

The etching process can be a dry etching process. The dry etching process can be implemented in an etching chamber. The dry etching process can implement an oxygen-containing gas, fluorine-containing gas (e.g., CF4, SF6, CH2F2, CHF3, and/or C2F6), chlorine-containing gas (e.g., Cl2, CHCl3, CCl4, and/or BCl3), bromine-containing gas (e.g., HBr, He and/or CHBR3), iodine-containing gas, other suitable gases and/or plasmas, and/or combinations thereof. In some embodiments, the dry etching process utilizes an O2 plasma treatment and/or an O2/N2 plasma treatment. Further, the dry etching process can be performed for a suitable duration.

Figure 12:
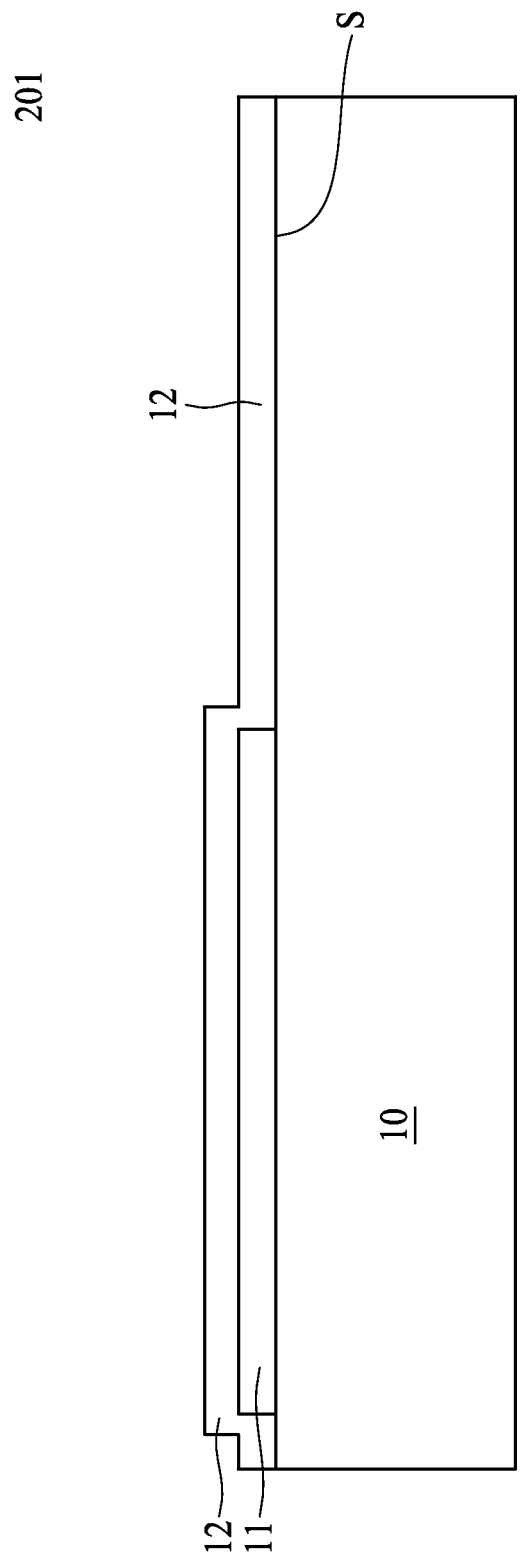

In FIG. 12, passivation layer 12 is formed covering bonding pads 11 comformally by a deposition process. For an example, the deposition process can include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure chemical vapor deposition (LPCVD) process, thermal oxidation, and/or combinations thereof.

Figure 13:
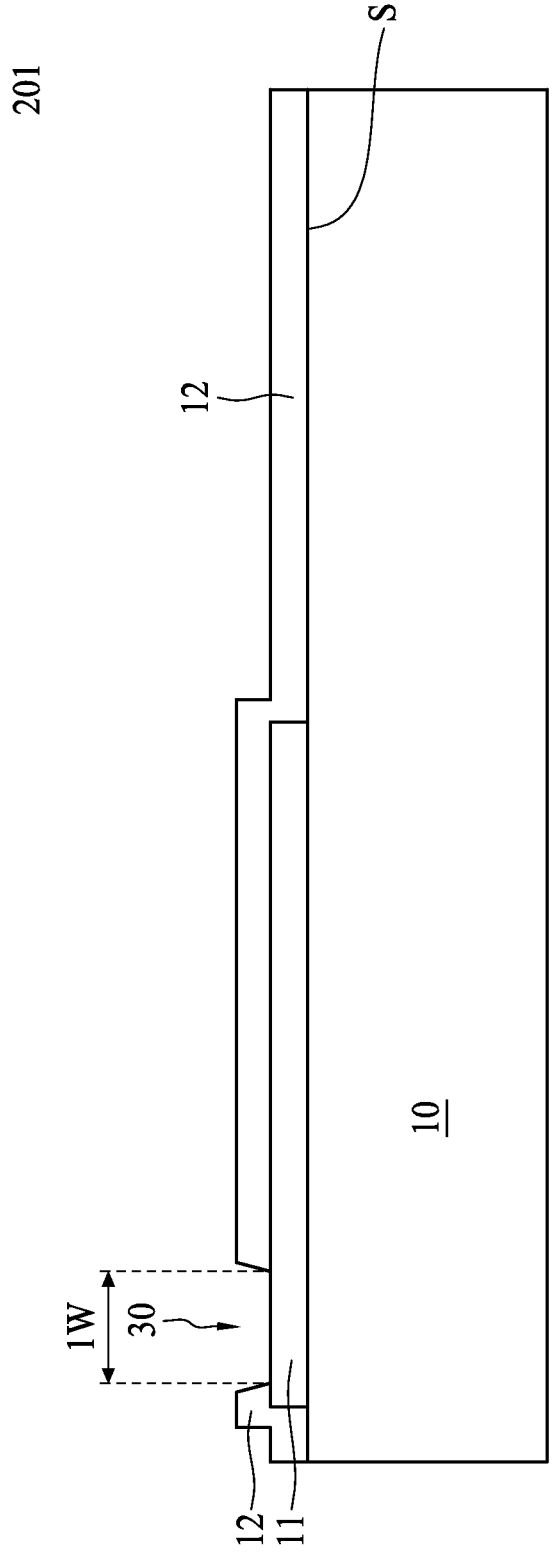

In FIG. 13, passivation layer 12 is recessed to form an opening to exposed underlying layer using a patterning and etching process. Passivation layer 12 is patterned by using masking methods, lithography technologies, etching processes, or combinations thereof. In one example, a layer of photoresist is formed over passivation layer 12 by a suitable process, and patterned to form a photoresist feature by a proper photolithography patterning method. A pattern on the photoresist is transferred by a suitable etching process to passivation layer 12 to form first opening 30 with width 1W. Some suitable etching process can include dry etching, wet etching, and/or other etching methods (e.g., reactive ion etching). The etching process can also be purely chemical (plasma etching), purely physical (ion milling), and/or combinations thereof. A hard mask (not shown) can be formed over passivation layer 12; a patterned photoresist is formed on the hard mask. The pattern of the photoresist is transferred to the hard mask and then transferred by an etching process to passivation layer 12. In some embodiments, a selective etching can be used to prevent etching some underlying layer, such as a bonding pad 11. A selective etching can include a higher etch rate on passivation layer 12 than on bonding pad 11 is within the contemplated scope of the present disclosure.

The selective etching can use some fluorine-containing gas, HBr and/or Cl2 as etch gases. In some embodiments, a bias voltage used in the etching process can be adjusted to allow better control of an etching direction to be isotropic or anisotropic. In some embodiments, an etching process can include selective etching with slower etching rate for conductive material than for dielectric materials such as polyimide (PI), silicon nitride, or silicon oxynitride in passivation layer 12. In some embodiments, a recessing process can be performed by one or plurality of etching processes. Different etchant can be used for etching different compositions of materials.

Figure 14:
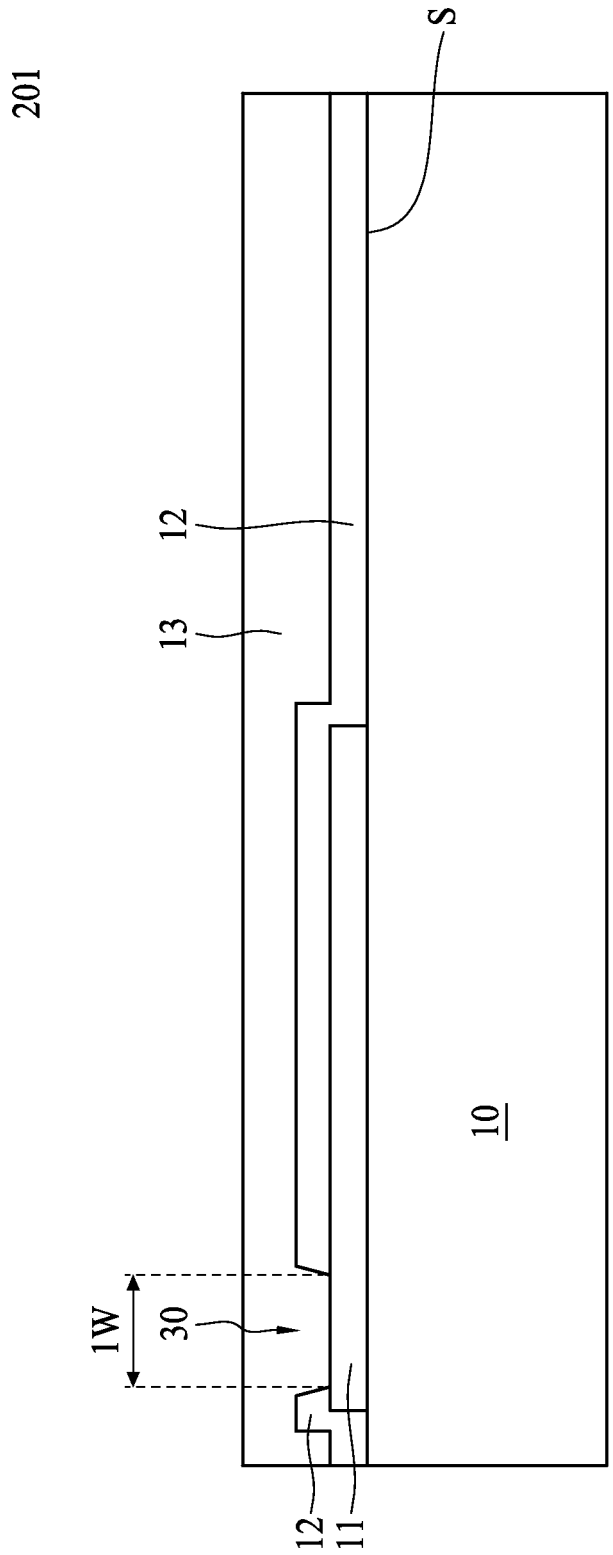

In FIG. 14, first protective layer 13 is blanked formed over passivation layer 12 by any suitable deposition process including a spin coating or other methods. First protective layer 13 is patterned to form second opening 14, through which a portion of bonding pad 11 is exposed. First protective layer 13 is also patterned to form third opening 15, through which a portion of passivation layer 12 is exposed, outside of a region covered by bonding pad 11.

The spin coating is a process used to form first protective layer 13 as a uniform thin films covering passivation layer 12.

A certain amount of a coating material is applied on top of wafer 200. Wafer 200 is spinning at a certain speed to spread the coating material by a centrifugal force.

A spinning is continued until a desired thickness of the film is achieved. The angular speed of the spinning controls a thickness of first protective layer 13. The thickness of first protective layer 13 is also depended on a viscosity, a drying rate, a surface tension, and a concentration of the coating material. The spin coating uses sol-gel precursors, which can be used to create uniform thin films with different thicknesses.

Figure 15:
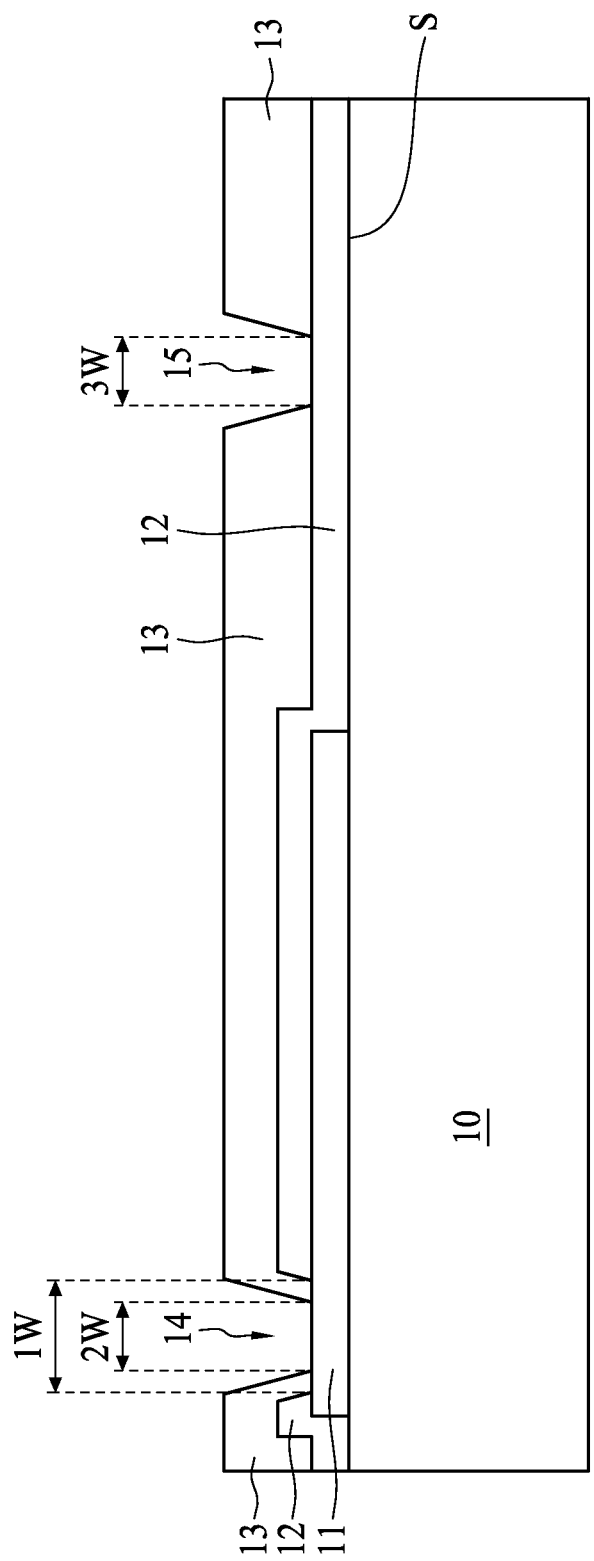

In FIG. 15, first protective layer 13 is patterned using a photolithography patterning method, during which first protective layer 13 is formed over by a suitable process such as the spin coating. The coating material is exposed to light through a reticle. The reticle is a mask including a patterned feature. The exposure to light causes a chemical change that allows some of the coating material to be removed by a developer to form some openings such as second opening 14 and third opening 15. For some examples, the developer includes sodium hydroxide (NaOH), or some metal-ion-free materials such as tetramethylammonium hydroxide (TMAH).

Figure 16:
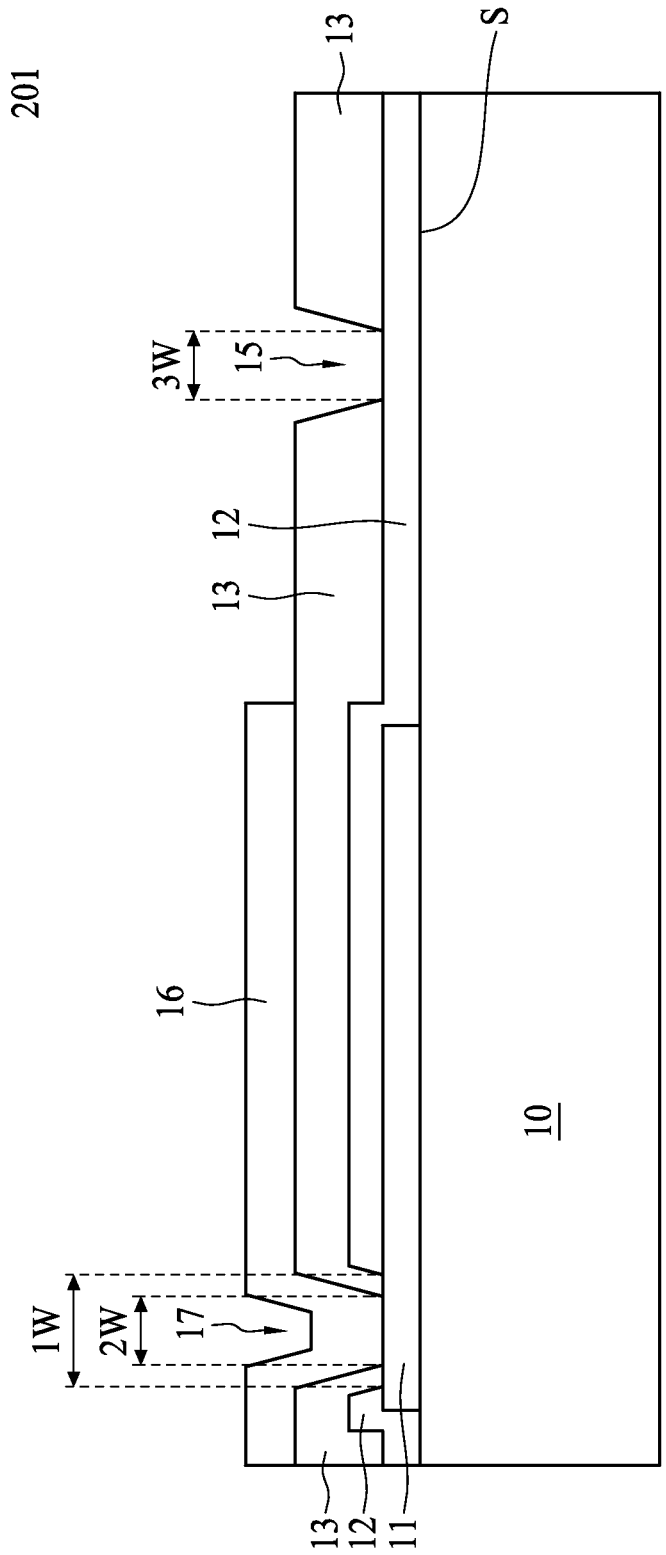

In FIG. 16, PPI layer 16 is formed on first protective layer 13 and electrically coupled to bonding pad 11 through second opening 14. PPI layer 16 is formed using plating, electroless plating, sputtering, chemical vapor deposition methods, and the like.

The electroless plating, also known as chemical or auto-catalytic plating, is a non-galvanic plating method. The electroless process is performed without using external electrical power, but uses some chemical formulations to deposit PPI layer 16 onto a surface of first protective layer 13. Some portions of a surface of first protective layer 13 or passivation layer 12, free of a plating material, is masked with some plugs, caps, or resists, which are then removed after the eletroless plating.

The sputtering is one of a method of depositing PPI layer 16 by some ions generated in plasma and accelerated toward a target material to dislodge, or sputter, some atoms from the target material. Some dislodged atoms from the target material migrate and condense on first protective layer 13 to form PPI layer 16.

Figure 17:
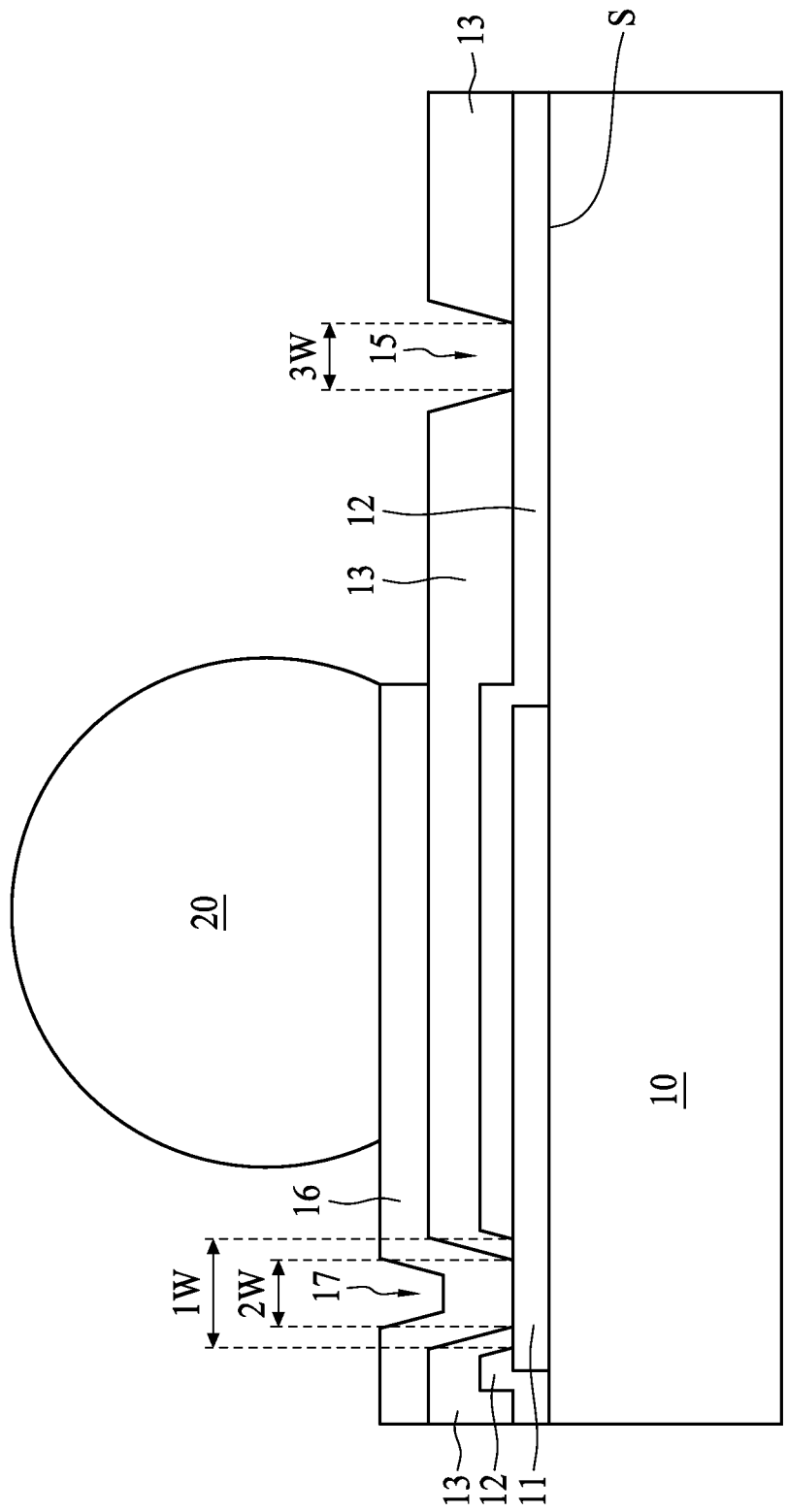

In FIG. 17, in some embodiments, conductor 20 is formed over PPI layer 16 by some suitable method of using a deposition or a stencil. The stencil is to transfer a solder material, such as a solder paste, onto a metal, such as PPI layer 16. A steel foil includes an opening for conductor 20 to be placed. Once the stencil is properly aligned on top of PPI layer 16, a solder paste is applied over the openings. After the steel foil is removed, the solder paste is remained. A thickness and an aperture opening size of the steel foil control a volume of the solder paste deposited on PPI layer 16. In some other embodiments, the solder material is formed by placing a preformed solder sphere onto PPI layer 16 and then reflowing the solder sphere.

Figure 18:
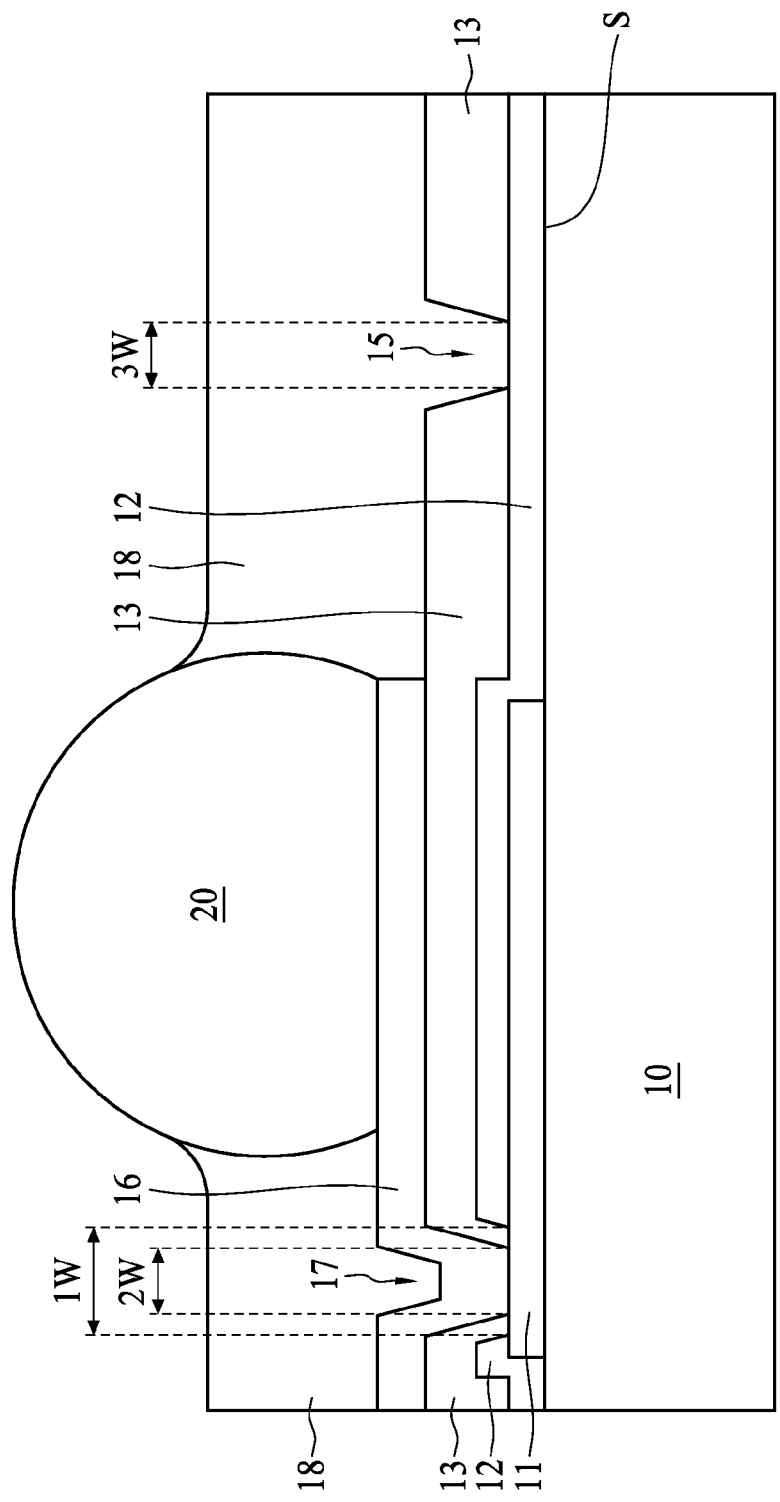

In FIG. 18, second protective layer 18 is blanket formed over first protective layer 13 and surrounding conductor 20 with conductor 20 partially exposed. Second protective layer 18 is also formed over opening 15 and recess 17. A formation of second protective layer 18 is by any suitable deposition process such as the spin coating used for forming first protective layer 13. A thickness of second protective layer 18 is controlled such that conductor 20 is partially exposed. The thickness is depended on a viscosity, a drying rate, a surface tension, and a concentration of the coating material for second protective layer 18.

Figure 19:
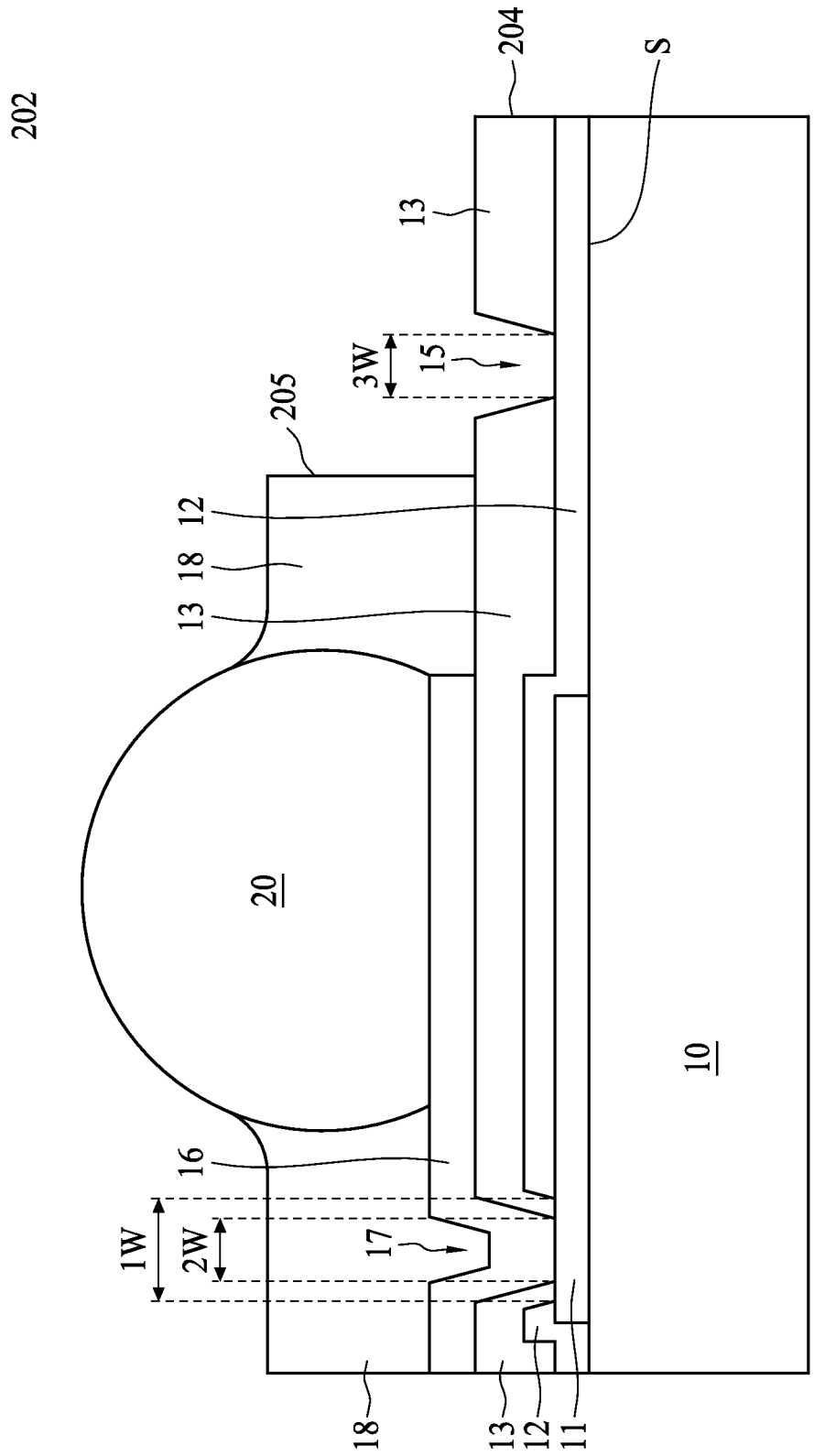

FIG. 19 is a cross sectional view of incomplete die 202. In FIG. 19, at a portion of incomplete die 202 close to perimeter 204 of wafer 200, a wafer edge exposure process is performed to remove some portions of second protective layer 18. In some embodiments, in the wafer edge exposure process, some portions of second protective layer 18 outside boundary 205 of wafer 200 is removed by means of a thinner.

Some embodiments of the present disclosure provide a semiconductive device, including a semiconductive substrate. A conductive pad is on the semiconductive substrate. A passivation layer covers the conductive pad and overlies the semiconductive substrate. A first protective layer overlies the passivation layer. The first protective layer includes an opening exposing a portion of the passivation layer, and the opening includes at least two lines in contact with each other. A post passivation interconnect (PPI) layer overlies the first protective layer. A conductor forms on the PPI layer.

Some embodiments of the present disclosure provide a semiconductive device in a chip, including a semiconductive substrate. A conductive pad overlies the semiconductive substrate. A passivation layer covers the conductive pad and overlies the semiconductive substrate. The passivation layer includes a conductive opening to expose a portion of the conductive pad. A first protective layer overlies the passivation layer. The first protective layer includes an opening, and the opening includes a first line segment contacting with a second line segment. A post passivation interconnect (PPI) layer overlies the first protective layer and covers the conductive pad to electrically couple with the conductive pad. A conductor forms on the PPI layer.

Some embodiments of the present disclosure provide a method for fabricating a package assembly including forming a conductive pad on a semiconductive substrate; forming a passivation layer on the conductive pad; forming a first protective layer on the passivation layer along with an opening to expose a portion of the passivation layer; forming a post passivation interconnect (PPI) layer on the first protective layer to contact the conductive pad; and forming a conductor on the PPI layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductive device, comprising:
a semiconductive substrate;
a conductive pad on the semiconductive substrate;
a passivation layer covering the conductive pad and overlying the semiconductive substrate;
a first protective layer overlying the passivation layer, wherein
the first protective layer comprises an opening exposing a portion of the passivation layer, and
the opening includes at least two lines in contact with each other;
a post passivation interconnect (PPI) layer overlying the first protective layer; and
a conductor formed on the PPI layer.

2. The semiconductive device of claim 1, wherein the first protective layer is covered by a second protective layer.

3. The semiconductive device of claim 2, wherein the second protective layer comprises a liquid molding compound (LMC).

4. The semiconductive device of claim 1, wherein the conductor is a solder material.

5. The semiconductive device of claim 1, wherein the conductive pad is a bonding pad.

6. The semiconductive device of claim 1, wherein the first protective layer comprises a polybenzoxazole (PBO).

7. The semiconductive device of claim 1, wherein the post passivation interconnect layer is copper or alloy thereof.

8. The semiconductive device of claim 1, wherein the opening is a cross shape, a T shape, or an L shape.

9. The semiconductive device of claim 1, wherein the openings are arranged in a fiducial array.

10. A semiconductive device in a chip, comprising:
a semiconductive substrate;
a conductive pad overlying the semiconductive substrate;
a passivation layer covering the conductive pad and overlying the semiconductive substrate;
the passivation layer comprising a conductive opening to expose a portion of the conductive pad;
a first protective layer overlying the passivation layer, wherein
the first protective layer comprises an opening, and the opening comprises a first line segment contacting with a second line segment;
a post passivation interconnect (PPI) layer overlying the first protective layer and covering the conductive pad to electrically couple with the conductive pad; and
a conductor formed on the PPI layer.

11. The semiconductive device of claim 10, wherein the first protective layer is underneath a liquid molding compound layer.

12. The semiconductive device of claim 10, wherein the first protective layer comprises a polybenzoxazole (PBO) material.

13. The semiconductive device of claim 10, wherein the post passivation interconnect layer comprises a conductive material.

14. The semiconductive device of claim 10, wherein the openings are arranged in a fiducial pattern.

15. A semiconductive device in a chip, comprising:
a semiconductive substrate;
a conductive pad overlying the semiconductive substrate;
a passivation layer covering the conductive pad and overlying the semiconductive substrate, wherein the passivation layer comprises a first opening to expose a portion of the conductive pad;
a first protective layer overlying the passivation layer, wherein
the first protective layer comprises a plurality of second openings, and each of the plurality of the second openings comprises a first line segment contacting with a second line segment;
a post passivation interconnect (PPI) layer overlying the first protective layer and covering the conductive pad to electrically couple with the conductive pad;
a conductor formed on the PPI layer; and
a second protective layer in contact with outer periphery of the conductor and overlying the PPI layer, wherein the second protective layer covers a portion of the first protective layer while exposing the second opening.

16. The semiconductive device of claim 15, wherein the first protective layer comprises a polybenzoxazole (PBO) material.

17. The semiconductive device of claim 15, wherein the second protective layer comprises a liquid molding compound (LMC).

18. The semiconductive device of claim 15, wherein the post passivation interconnect layer comprises a conductive material.

19. The semiconductive device of claim 15, wherein the plurality of the second openings are arranged in a fiducial pattern.

20. The semiconductive device of claim 15, wherein the first line segment and the second line segment are orthogonal to each other.

* * * * *